United States Patent
Ladurner et al.

(10) Patent No.: US 10,153,762 B2
(45) Date of Patent: Dec. 11, 2018

(54) METHOD FOR CONTROLLING A SEMICONDUCTOR COMPONENT

(75) Inventors: Markus Ladurner, Villach (AT); Robert Illing, Villach (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 737 days.

(21) Appl. No.: 13/436,380

(22) Filed: Mar. 30, 2012

(65) Prior Publication Data

US 2013/0257515 A1   Oct. 3, 2013

(51) Int. Cl.
*H03K 17/082* (2006.01)
*H03K 17/16* (2006.01)

(52) U.S. Cl.
CPC ....... *H03K 17/0822* (2013.01); *H03K 17/167* (2013.01)

(58) Field of Classification Search
CPC .... H03K 17/16; H03K 17/164; H03K 17/167; H03K 17/0822
USPC ......................................... 327/380, 381, 434
See application file for complete search history.

(56) References Cited

U.S. PATENT DOCUMENTS

| | | | |
|---|---|---|---|
| 6,414,524 B1 * | 7/2002 | Chen | 327/112 |
| 7,215,205 B2 | 5/2007 | Kitlinski et al. | |
| 7,230,470 B1 * | 6/2007 | You et al. | 327/427 |
| 8,015,419 B2 * | 9/2011 | Rowhani et al. | 713/300 |
| 8,415,987 B2 | 4/2013 | Brueckl et al. | |
| 2008/0218241 A1 | 9/2008 | Nagano et al. | |
| 2010/0079119 A1 * | 4/2010 | Ladurner et al. | 323/234 |
| 2012/0268091 A1 * | 10/2012 | Takemae | 323/272 |

FOREIGN PATENT DOCUMENTS

| | | |
|---|---|---|
| CN | 1716761 A | 1/2006 |
| CN | 102077305 A | 5/2011 |
| DE | 102008010467 A1 | 9/2009 |
| DE | 10 2008 045 614 A1 | 3/2010 |

\* cited by examiner

*Primary Examiner* — Lincoln Donovan
*Assistant Examiner* — Colleen O Toole
(74) *Attorney, Agent, or Firm* — Slater Matsil, LLP

(57) ABSTRACT

A transistor monolithically integrated in a semiconductor body includes a first sub-transistor and a second sub-transistor that both include a first and second load contacts and a control contact for controlling an electric current through a load path. The first load contact of the first sub-transistor is electrically connected to the first load contact of the second sub-transistor and the second load contact of the first sub-transistor is electrically connected to the second load contact of the second sub-transistor. A control circuit is configured to cause the first sub-transistor to switch from a first state to a second state at a first point of time and to cause the second sub-transistor to switch from the first state to the second state at a second point of time subsequent to the first point of time.

35 Claims, 3 Drawing Sheets

FIG 5
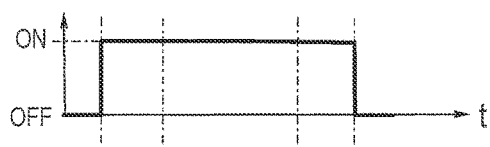
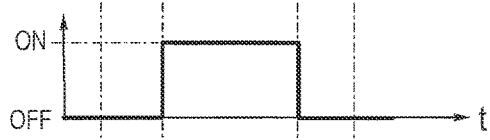
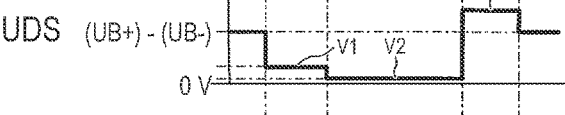
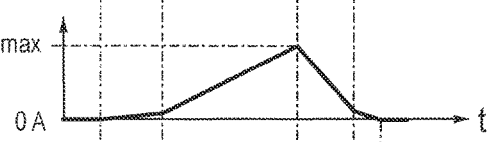
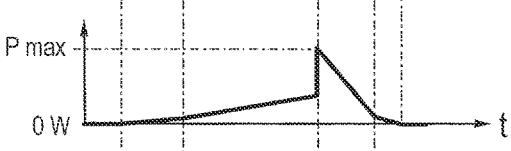
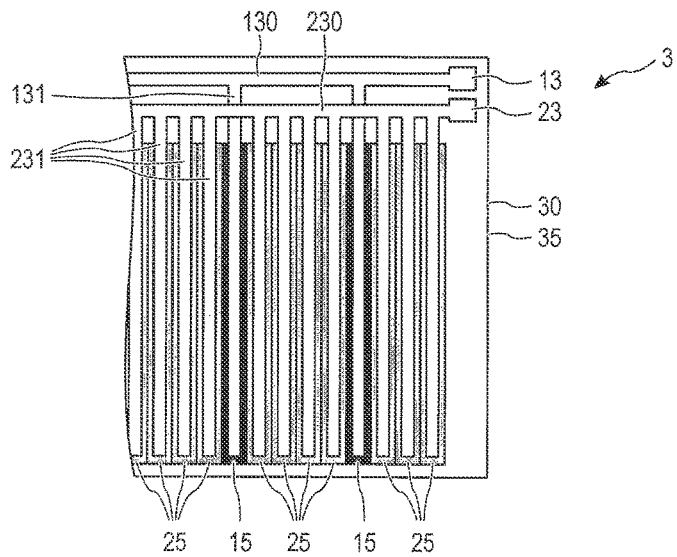
FIG 6

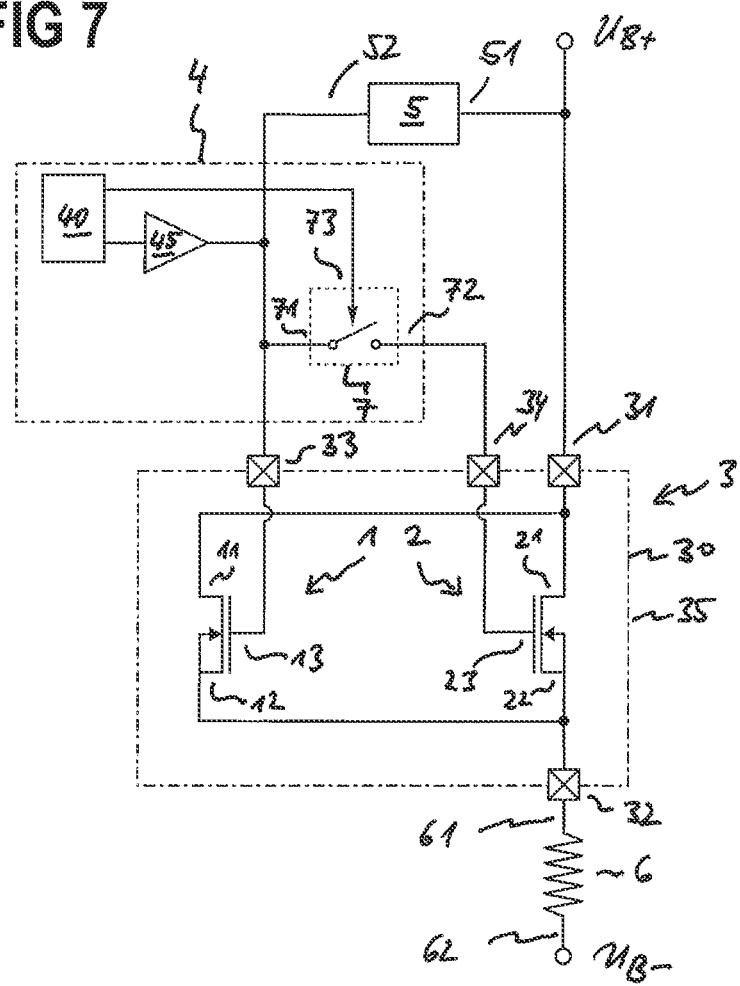

METHOD FOR CONTROLLING A SEMICONDUCTOR COMPONENT

TECHNICAL FIELD

Embodiments of the invention relate to a method for controlling a semiconductor component.

BACKGROUND

In conventional circuits such as power converters or motor drives, a transistor is used for supplying electric power to an inductive load. As high inductive voltages appear during off-commutation, the product of a voltage drop over the transistor and the transistor current transiently reaches high values. Hence, it is a goal of the present invention to efficiently operate a semiconductor component without exceeding the maximum energy strength of the component.

SUMMARY OF THE INVENTION

According to one aspect of the invention, a method for controlling a semiconductor component is provided. A semiconductor component has a semiconductor body and a transistor monolithically integrated in the semiconductor body. The transistor includes a first sub-transistor and a second sub-transistor. The first sub-transistor has a first load contact, a second load contact, a first load path formed between the first load contact and the second load contact of the first sub-transistor, and a first control contact for controlling an electric current through the first load path. Accordingly, the second sub-transistor includes a first load contact, a second load contact, a second load path formed between the first load contact and the second load contact of the second sub-transistor, and a second control contact for controlling an electric current through the second load path. The first load contact of the first sub-transistor is electrically connected to the first load contact of the second sub-transistor. The second load contact of the first sub-transistor is electrically connected to the second load contact of the second sub-transistor. Further, the first sub-transistor has a first ON-state resistance and the second sub-transistor has a second ON-state resistance. The first sub-transistor is switched ON at a first point of time and the second sub-transistor is subsequently switched ON at a second point of time.

According to a further aspect of the invention, a method for switching OFF a semiconductor component is provided. A semiconductor component has a semiconductor body and a transistor monolithically integrated in the semiconductor body. The transistor includes a first sub-transistor that is in its ON-state and a second sub-transistor that is in its ON-state. The first sub-transistor has a first load contact, a second load contact, a first load path formed between the first load contact and the second load contact of the first sub-transistor, and a first control contact for controlling an electric current through the first load path. Accordingly, the second sub-transistor includes a first load contact, a second load contact, a second load path formed between the first load contact and the second load contact of the second sub-transistor, and a second control contact for controlling an electric current through the second load path. The first load contact of the first sub-transistor is electrically connected to the first load contact of the second sub-transistor. The second load contact of the first sub-transistor is electrically connected to the second load contact of the second sub-transistor. Further, the first sub-transistor has a first ON-state resistance and the second sub-transistor has a second ON-state resistance. The second sub-transistor is switched OFF at a first point of time and the first sub-transistor is subsequently switched OFF at a second point of time.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 5 is a timing diagram that illustrates the timing of several representative signals of the circuit of FIG. 1;

FIG. 6 is a top view of a section of a transistor that has first and second sub-transistors; and FIG. 7 is a circuit diagram of a modification of the circuit of FIG. 1.

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
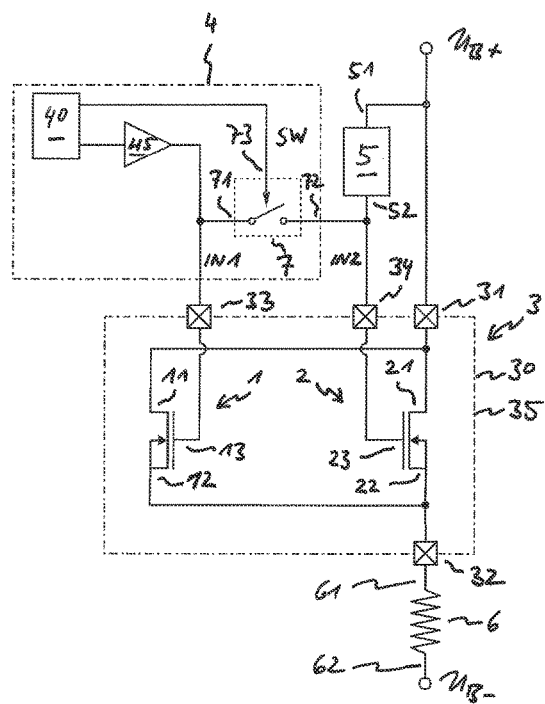
FIG. 1 is a circuit diagram of a circuit with a semiconductor component that is controlled by a control circuit.

Referring now to FIG. 1 there is illustrated a semiconductor circuit. A semiconductor component 30 includes a transistor 3 that is monolithically integrated in a semiconductor body 35. The transistor 3 has a first sub-transistor 1 and a second sub-transistor 2. For instance, the transistor 3 and the first and second sub-transistors 1 and 2, respectively, may be DMOS (DMOS=double diffusion metal oxide) transistors. However, the invention is not limited to DMOS transistors. Another kind of field effect transistors may be used as well.

The first sub-transistor 1 has a first load contact 11, a second load contact 12, and a first control contact 13. A first load path that can be controlled by the first control contact 13 is formed between the first load contact 11 and the second load contact 12. Accordingly, the second sub-transistor 2 has a first load contact 21, a second load contact 22, and a second control contact 23. A second load path that can be controlled by the second control contact 23 is formed between the first load contact 21 and the second load contact 22.

In order to connect the first and second load paths electrically in parallel, the first load contact 11 of the first sub-transistor 1 is electrically connected to the first load contact 21 of the second sub-transistor 2 and the second load contact 12 of the first sub-transistor 1 is electrically connected to the second load contact 22 of the second sub-transistor 2.

The transistor 3 has a first load terminal 31, a second load terminal 32, a first control terminal 33 and a second control terminal 34. The first control contact 13 is connected to the first control terminal 33 and the second control contact 23 is connected to the second control terminal 34. A main load path of the transistor 3 that can be controlled by via both the first and second control terminals 33, 34 is formed between the first load contact 31 and the second load contact 32.

If the first sub-transistor 1 is fully switched ON (i.e. in its conductive state) via an appropriate control signal applied to the first control contact 13 via the first control terminal 33, the first load path has its lowest possible resistance which will subsequently be referred to as "first ON-state resistance R1ON". Accordingly, if the second sub-transistor 2 is fully switched ON via an appropriate control signal applied to the second control contact 23 via the second control terminal 34, the second load path has its lowest possible resistance which will subsequently be referred to as "second ON-state resistance R2ON."

As the first and second control contacts 13, 23 are operable independently from each other, the resistance R3 of the main load path of the transistor 3 can be adapted to the required function of the circuit by switching only the first sub-transistor 1, only the second subtransistor 2, or both the first and second sub-transistors 1 and 2 in the ON-state. If the first sub-transistor 1 is switched ON and the second sub-transistor 2 is switched OFF, the resistance R3 of the main load path is equal to R1ON, and if the first sub-transistor 1 is switched OFF and the second sub-transistor 2 is switched ON, the resistance R3 of the main load path is equal to R2ON. If both the first sub-transistor 1 and the second sub-transistor 2 are switched ON, the resistance R3 of the main load path is equal to the ON-state resistance R3ON of the transistor 3. The ON-state resistance R3ON can be calculated as follows:

$$R3ON = \frac{R1ON \cdot R2ON}{R1ON + R2ON} \quad (1)$$

If both the first sub-transistor 1 and the second sub-transistor 2 are switched OFF, the transistor 3 is also switched OFF.

The first ON-state resistance R1ON may be equal to or different from the second ON-state resistance R2ON. Preferably, the first ON-state resistance R1ON is greater than the second ON-state resistance R2ON. For instance, the first ON-state resistance R1ON may be at least 2-times greater than the second ON-state resistance R2ON.

In the following example which is not intended to limit the scope of the present invention, the first ON-state resistance R1ON=16 mΩ and the second ON-state resistance R2ON=5.33 mΩ. Hence, if the first sub-transistor 1 is switched ON and the second sub-transistor 2 is switched OFF, the resistance R3=16 mΩ if the first sub-transistor 1 is switched OFF and the second sub-transistor 2 is switched ON, the resistance R3=5.33 mΩ and if both the first sub-transistor 1 and the second sub-transistor 2 are switched ON, the resistance R3≈4 mΩ. Summarized, the main transistor 3 can be operated at three different conductive states simply by controlling the transistor 3 using one or more conventional digital signals applied to the first and second control terminals 33, 34.

In the circuit of FIG. 1, the transistor 3 is used for providing a load 6, for instance an inductive load 6 (e.g., a motor or a transformer) with electric power. To this, the load 6 has a first contact 61 that is connected to the second main terminal 32. The first load terminal 31 is connected to a first electric supply potential UB+ and a second contact 62 of the load 6 is connected to a second supply potential UB−. If the first and second supply potentials UB+ and UB− are different, a voltage drop over the main load path of the transistor 3 and the first and second load paths occurs as well.

In order to avoid the problem mentioned at the beginning, the first and second sub-transistors 1, 2 are fully switched ON successively and then also switched OFF successively as will now be explained with reference to FIG. 5 which is a timing diagram that illustrates the timing of several representative signals of the circuit of FIG. 1.

FIG. 5 shows six diagrams which will be described from top to bottom. A first control signal IN1 supplied to the first contact terminal 33, a second control signal IN2 supplied to the second contact terminal 34, the voltage drop UDS over the main load path between the first and second main terminals 31, 32, the electric current IDS through the main load path between the first and second main terminals 31, 32, the power P=UDS·IDS, and the resistance R3 of the main load path between the first and second main terminals 31, 32.

The first and second controls signal IN1 and IN2 are provided by a control circuit 4. As illustrated in FIG. 1, the control circuit 4 may have a controller 40 that supplies a control signal to a driver 45. The driver 45 provides the output signal IN1. One or both of the control signals IN1 and IN2 may be digital signals, that is, signals that toggle between only two pre-defined states (in FIG. 5 marked with "ON" and "OFF"). However, it is, as illustrated in the embodiment of FIG. 1, also possible to use analog signals for IN1 and IN2. Starting from both the first and second sub-transistors 1, 2 being switched OFF, the first sub-transistor 1 is fully switched ON at a first point of time t1 by changing the first control signal IN1 from an OFF-level to an ON-level whilst the second sub-transistor 2 remains switched OFF. That is, both the first load path and the main load path have the resistance R1ON (16 mΩ in the above example), a current IDS through the main load path arises and the voltage VDS over the main load path drops from about (UB+)−(UB−) to a first value V1 that substantially depends on the R3=R1ON and the resistance of the inductive load 6.

Whilst the first sub-transistor 1 is subsequently kept in its ON-state, also the second sub-transistor 2 is fully switched ON at a second point of time t2 by changing the second control signal IN2 from an OFF-level to an ON-level. That is, the first load path has the resistance R1ON (16 mΩ in the above example), the second load path has the resistance R2ON (5.33 mΩ in the above example), and the main load path has the resistance R3ON (4 mΩ in the above example). As both the first and second sub-transistors 1, 2 are switched ON, the resistance R3 of the main load path is reduced compared to the interval between t1 and t2 and the electric current IDS through the main load path increases, and the voltage VDS over the main load path further drops from the first value V1 to a second value V2 that substantially depends on R3=R3ON and the resistance of the inductive load 6.

Figure 2:
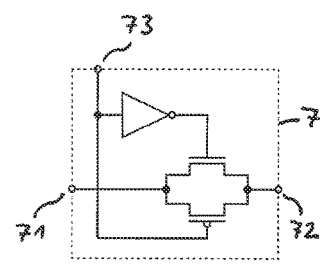
FIG. 2 is a circuit diagram of a transfer gate that may be used in the circuit of FIG. 1.

For switching ON also the second sub-transistor 2, a controllable bidirectional analog switch 7 is provided. The analog switch 7 has a load path that is formed between a first contact 71 and a second contact 72 and that can be opened or closed via a control signal SW that is provided by the controller 40 and supplied to a control input 73 of the switch 7. A possible embodiment of a bidirectional analog switch 7 may be a transfer gate as illustrated in FIG. 2. However, any other transfer gate or controllable bidirectional switch may also be used.

If in the circuit of FIG. 1 the switch 7 is closed, the first control signal IN1 applied to the first control terminal 33 is transferred to the second control terminal 34 via the switch 7 and supplied also to the second control terminal 34 such that the second sub-transistor 2 is switched ON. That is, the second control signal IN2 is equal to the first control signal IN1.

Subsequently, at a third point of time t3 the second sub-transistor 2 is switched OFF whilst the first sub-transistor 1 is kept in its ON-state. As a result, both the first load path and the main load path have the resistance R1ON (16 mΩ in the above example). For switching the second sub-transistor 2 OFF, the control signal SW supplied to the control input 73 is changed such that the analog switch 7 is opened and the conductive connection between the first control terminal 33 and the second control terminal 34 is interrupted. As a consequence, the first control signal is no longer transferred to the second control terminal 34 and the second sub-transistor 2 is switched OFF.

However, due to switching the second sub-transistor 2 OFF and due to the increase of the resistance R3 (from 4 mΩ to 16 mΩ in the above example), the energy stored in the magnetic field of the inductive load 6 causes a significant induced voltage that superimposes the supply voltage (UB+)−(UB−) such that the voltage drop UDS over the main load path exceeds the supply voltage (UB+)−(UB−).

Figure 3:
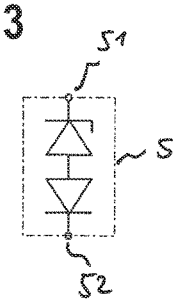
FIG. 3 is a circuit diagram of a protection circuit that may be used in the circuit of FIG. 1.

In order to avoid a damage of the transistor 3 caused by that induced voltage, an optional protection circuit 5 is coupled with a first contact 51 to the first load terminal 31 and with a second contact 52 to the second control terminal 34. A possible embodiment of a protection circuit 5 is illustrated in FIG. 3 which is a clamping circuit formed by two diodes connected in series. However, any other protection circuit may also be used.

If the protection circuit 5 detects that the voltage drop UDS over the main load path of the transistor 3 exceeds a pre-defined value, it supplies a signal to the second control terminal 34 such that the resistance of the second load path is reduced and, coming along therewith, the voltage drop UDS over the main load path of the transistor 3 is also reduced to a non-hazardous value V3.

At a fourth point of time t4 subsequent to the third point of time t3, the first sub-transistor 1 is also switched OFF by changing the first control signal IN1 from an ON-level to an OFF-level whilst the first sub-transistor 1 is kept in its OFF-state by keeping the analog switch 7 opened. As a result, both the first and second sub-transistors 1, 2 are switched OFF and the current IDS through the main load path of the transistor 3 is reduced to zero.

As the first and second subtransistors 1, 2 are switchend OFF time shifted, the maximum Pmax of the transistor power P=UDS·IDS is significantly reduced compared to the maximum power that occurs if a conventional transistor (i.e., without independently switchable sub-transistors) that has the same ON-state resistance R3ON had been used instead of the transistor 3 explained above.

Figure 4A:
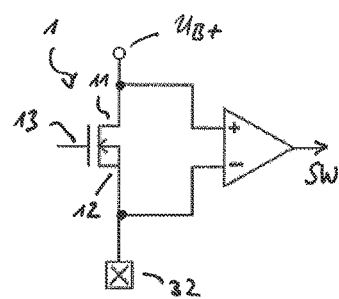
FIG. 4A is a circuit diagram of a first sub-circuit that may be used in the circuit of FIG. 1 for generating a signal for switching the second sub-transistor ON and OFF.
Figure 4B:
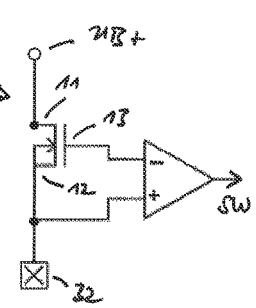
FIG. 4B is a circuit diagram of a second sub-circuit that may be used in the circuit of FIG. 1 for generating a signal for switching the second sub-transistor ON and OFF.
Figure 4C:
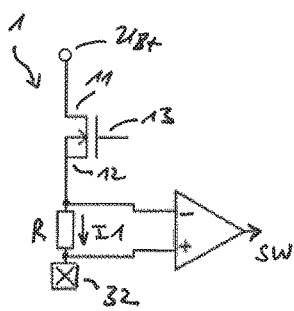
FIG. 4C is a circuit diagram of a third sub-circuit that may be used in the circuit of FIG. 1 for generating a signal for switching the second sub-transistor ON and OFF.

FIGS. 4A to 4C illustrate three embodiments for generating a control signal SW that may be used in a circuit as described above with reference to FIG. 1. In the embodiment of FIG. 4A, the output signal SW is set to close the bidirectional switch 7 (FIGS. 1 and 2) if the voltage drop over the first load path falls below a pre-defined value, and to open the bidirectional switch 7 otherwise.

In the embodiment of FIG. 4B, the output signal SW is set to close the bidirectional switch 7 (FIGS. 1 and 2) if the absolute value of the voltage difference between the first control contact 13 and the second load contact 12 of the first sub-transistor 1 exceeds a pre-defined value, and to open the bidirectional switch 7 otherwise. The pre-defined value is preferably set to a value at which the first sub-transistor 1 is operated above its temperature compensation point.

In the further embodiment of FIG. 4C, the output signal SW is set to close the bidirectional switch 7 (FIGS. 1 and 2) if the absolute value of the voltage drop over a resistor R (which voltage drop is a measure for the current I1 that flows through the first load path) that is connected in series with the first load path exceeds a pre-defined value, and to open the bidirectional switch 7 otherwise.

An example of a transistor 3 that has first and second sub-transistors 1, 2 as explained above is illustrated in FIG. 6. The transistor comprises a cell structure with a plurality of controllable first transistor cells 15 and a plurality of controllable second transistor cells 25. For the sake of distinguishability, the first transistor cells 15 are marked dark grey in the drawing, the second transistor cells 25 light grey. All controllable first transistor cells 15 are electrically connected in parallel and form the first sub-transistor 1. Accordingly, all controllable second transistor cells 25 are electrically connected in parallel and form the second sub-transistor 2. The first transistor cells 15 can commonly be controlled via the first control contact 13, the second transistor cells 25 via the second control contact 23.

The control inputs (gates) of the first transistor cells 15 are electrically connected to the first control contact 13 via gate fingers 131 and a gate runner 130. Accordingly, the second transistor cells 25 are electrically connected to the second control contact 23 via gate fingers 231 and a gate runner 230.

In the illustrated embodiment, the first and second transistor cells 15, 25 are formed as longish stripes. However, any other cell structure may also be used.

Optionally, the first transistor cells 15 and the second transistor cells 25 may be identical and have identical ON-state resistances. In order to achieve a first sub-transistor 1 and a second sub-transistor 2 having different ON-state resistances R1ON and R2ON, respectively, with R1ON>R2ON, the number of parallel connected second transistor cells 25 that form the second sub-transistor 2 may exceed the number of parallel connected first transistor cells 15 that form the first sub-transistor 1. As a result, the ON-state resistance R1ON of the first sub-transistor 1 exceeds the ON-state resistance R2ON of the second sub-transistor 2.

FIG. 7 is a circuit diagram of a modification of the circuit of FIG. 1 The sole difference to the circuit of FIG. 1 is that the second contact 52 of the protection circuit 5 is coupled to the first control terminal 33 rather than to the second control terminal 34 so that in case of an overvoltage event the first sub-transistor 1 that has a higher ON-state resistance as the second sub-transistor 2 is at least partly switched ON via the control circuit 5.

In the embodiments explained above, the first load contacts 11 and 21 are drain contacts and the second load contacts 12 and 22 are source contacts. However, it is also possible that the first load contacts 11 and 21 are source contacts and the second load contacts 12 and 22 are drain contacts.

Spatially relative terms such as "under," "below," "lower," "over," "upper," and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc., and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an," and "the," are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents. In particular, the features/method steps of different embodiments may be combined in an arbitrary manner unless the combination of certain features/method steps is technically impossible.

What is claimed is:

1. A method for controlling a semiconductor component that comprises a semiconductor body and a transistor monolithically integrated in the semiconductor body; wherein the transistor comprises a first sub-transistor and a second sub-transistor;
   wherein the first sub-transistor comprises a first load contact, a second load contact, a first load path formed between the first load contact and the second load contact of the first sub-transistor, and a first control contact for controlling an electric current through the first load path;
   wherein the second sub-transistor comprises a first load contact, a second load contact, a second load path formed between the first load contact and the second load contact of the second sub-transistor, and a second control contact for controlling an electric current through the second load path;
   wherein the first load contact of the first sub-transistor is electrically connected to the first load contact of the second sub-transistor;
   wherein the second load contact of the first sub-transistor is electrically connected to the second load contact of the second sub-transistor;
   wherein the first sub-transistor has a first resistance in an ON-state and a higher second resistance in an OFF-state and the second sub-transistor has a third resistance in an ON-state and a higher fourth resistance in an OFF-state;
   wherein the method comprises:
   measuring a voltage drop over the first load path;
   switching on the first sub-transistor to the ON-state at a first point of time; and
   switching on the second sub-transistor to the ON-state at a second point of time subsequent to the first point of time in response to the measured voltage drop over the first load path falling below a first pre-defined value.

2. The method as claimed in claim 1, wherein, after being switched on at the first point of time, the first sub-transistor is kept in its ON-state at least until the second point of time.

3. The method as claimed in claim 1, further comprising switching the second sub-transistor to its OFF-state at a third point of time subsequent to the second point of time.

4. The method as claimed in claim 3 wherein:
   the first sub-transistor is kept in its ON-state between the first point of time and the third point of time; and
   the second sub-transistor is kept in its ON-state between the second point of time and the third point of time.

5. The method as claimed in claim 3, further comprising switching the first sub-transistor to its OFF-state at a fourth point of time subsequent to the third point of time.

6. The method as claimed in claim 5, wherein the second sub-transistor is kept in its OFF-state between the third point of time and the fourth point of time.

7. The method as claimed in claim 1, wherein the first resistance is greater than the third resistance.

8. The method as claimed in claim 7, wherein the first resistance is at least two times greater than the third resistance.

9. The method as claimed in claim 1, further comprising controlling the first sub-transistor via the first control contact and the second sub-transistor via the second control contact, wherein the controlling is performed by a control circuit.

10. The method as claimed in claim 9, wherein the control circuit is configured to provide control signals for controlling the first sub-transistor via the first control contact and the second sub-transistor via the second control contact.

11. The method as claimed in claim 9, wherein the control circuit comprises a bidirectional switch that is coupled between the first control contact and the second control contact.

12. The method as claimed in claim 11, wherein the bidirectional switch comprises a transfer gate.

13. The method as claimed in claim 1, wherein the transistor is a DMOS transistor.

14. The method as claimed in claim 1, comprising:
   providing an inductive load that has a first contact and a second contact;
   connecting the first contact to both the second load contact of the first sub-transistor and the second load contact of the second sub-transistor;
   connecting both the first load contact of the first sub-transistor and the first load contact of the second sub-transistor to a first supply potential; and
   connecting both second contact of the inductive load to a second supply potential that is different from the first supply potential.

15. The method as claimed in claim 1, wherein the second sub-transistor is further switched to its ON-state at the second point of time if
   an electric current through the first load path exceeds a second pre-defined value.

16. The method as claimed in claim 1, wherein the second sub-transistor is switched to its ON-state at the second point of time if the absolute value of a voltage between the first control contact and the second load contact of the first sub-transistor exceeds a pre-defined value.

17. The method as claimed in claim 16, wherein the first sub-transistor comprises a temperature compensation point and wherein the pre-defined value is greater than a value at which the first sub-transistor is operated above its temperature compensation point.

18. A method for operating a semiconductor component that comprises a semiconductor body and a transistor monolithically integrated in the semiconductor body, the transistor comprising a first sub-transistor having an ON-state and an OFF-state and a second sub-transistor having an ON-state and an OFF-state, the method comprising:
  causing the first sub-transistor to be in its ON-state and the second sub-transistor to be in its ON-state, wherein the first sub-transistor comprises a first load contact, a second load contact, a first load path formed between the first load contact and the second load contact of the first sub-transistor, and a first control contact for controlling an electric current through the first load path and wherein the second sub-transistor comprises a first load contact, a second load contact, a second load path formed between the first load contact and the second load contact of the second sub-transistor, and a second control contact for controlling an electric current through the second load path, the first load contact of the first sub-transistor being electrically connected to the first load contact of the second sub-transistor and the second load contact of the first sub-transistor being electrically connected to the second load contact of the second sub-transistor;
  measuring a voltage drop over the first load path;
  switching the second sub-transistor to its OFF-state at a first point of time in response to the measured voltage drop over the first load path exceeding a first pre-defined value; and
  switching the first sub-transistor to its OFF-state at a second point of time subsequent to the first point of time.

19. The method as claimed in claim 18, wherein the second sub-transistor is further switched to its OFF-state at the first point of time if
  an electric current through the first load path falls below a second pre-defined value.

20. The method as claimed in claim 18, wherein the second sub-transistor is switched to its OFF-state at the first point of time if the absolute value of a voltage between the first control contact and the second load contact of the first sub-transistor falls below a pre-defined value.

21. The method as claimed in claim 20, wherein the first sub-transistor comprises a temperature compensation point and wherein the pre-defined value is greater than a value at which the first sub-transistor is operated above its temperature compensation point.

22. The method as claimed in claim 18, wherein first sub-transistor has an ON-state resistance that is greater than an ON-state resistance of the second sub-transistor.

23. A semiconductor circuit comprising:
  a semiconductor component comprising a semiconductor body and a transistor monolithically integrated in the semiconductor body;
    wherein the transistor comprises a first sub-transistor and a second sub-transistor;
    wherein the first sub-transistor comprises a first load contact, a second load contact, a first load path formed between the first load contact and the second load contact of the first sub-transistor, and a first control contact for controlling an electric current through the first load path;
    wherein the second sub-transistor comprises a first load contact, a second load contact, a second load path formed between the first load contact and the second load contact of the second sub-transistor, and a second control contact for controlling an electric current through the second load path;
    wherein the first load contact of the first sub-transistor is electrically connected to the first load contact of the second sub-transistor;
    wherein the second load contact of the first sub-transistor is electrically connected to the second load contact of the second sub-transistor;
    wherein the first sub-transistor has an ON-state and an OFF-state and the second sub-transistor has an ON-state and an OFF-state; and
  a control circuit, configured to
    measure a voltage drop over the first load path; and
    cause the first sub-transistor to switch from a first state to a second state at a first point of time and to cause the second sub-transistor to switch from the first state to the second state at a second point of time subsequent to the first point of time dependent on the measured voltage drop over the first load path.

24. The circuit as claimed in claim 23, wherein the first state is the ON-state and the second state is the OFF-state.

25. The circuit as claimed in claim 23, wherein the first state is the OFF-state and the second state is the ON-state.

26. The circuit as claimed in claim 23, further comprising an inductive load that has a first contact and a second contact, wherein the first contact to is connected both the second load contact of the first sub-transistor and the second load contact of the second sub-transistor, wherein both the first load contact of the first sub-transistor and the first load contact of the second sub-transistor are connected to a first supply potential, and wherein the second contact of the inductive load is connected to a second supply potential that is different from the first supply potential.

27. The circuit as claimed in claim 23, wherein the control circuit is configured to provide control signals for controlling the first sub-transistor via the first control contact and the second sub-transistor via the second control contact.

28. The circuit as claimed in claim 23, wherein the control circuit comprises a bidirectional switch that is coupled between the first control contact and the second control contact.

29. The circuit as claimed in claim 28, wherein the bidirectional switch comprises a transfer gate.

30. The method of claim 15, wherein the second sub-transistor is switched to its ON-state at the second point of time when the electric current through the first load path exceeds the second pre-defined value, and the electric current is detected by measuring a voltage across a resistor coupled in series with the first load path.

31. The method of claim 1, wherein the second sub-transistor is switched to its OFF-state at the first point of time when the voltage drop over the first load path exceeds the first pre-defined value.

32. The method of claim 15, wherein the second sub-transistor is switched to its OFF-state at the second point of time when the electric current through the first load path falls below the second pre-defined value, and the electric current is detected by measuring a voltage across a resistor coupled in series with the first load path.

33. The method of claim 1, wherein measuring the voltage drop comprises using a comparator.

34. The method of claim 18, wherein measuring the voltage drop comprises using a comparator.

35. The circuit as claimed in claim 23, wherein the control circuit comprises a comparator configured to measure the voltage drop.

* * * * *